(12) United States Patent
Chen et al.

(10) Patent No.: US 9,059,373 B2
(45) Date of Patent: Jun. 16, 2015

(54) PROTECTING A THERMAL SENSITIVE COMPONENT IN A THERMAL PROCESS

(71) Applicant: International Business Machines Corporation, Armonk, NY (US)

(72) Inventors: Cliff Chen, Taipei (TW); Ben Chiu, Taipei (TW); Michk Huang, Taipei (TW); Theron L Lewis, Rochester, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 138 days.

(21) Appl. No.: 13/663,811

(22) Filed: Oct. 30, 2012

(65) Prior Publication Data

US 2013/0107460 A1   May 2, 2013

(30) Foreign Application Priority Data

Oct. 31, 2011   (TW) ............... 100139655 A

(51) Int. Cl.
  *H05K 3/34*   (2006.01)
  *H01L 35/32*  (2006.01)
  *H05K 3/22*   (2006.01)

(52) U.S. Cl.
  CPC .......... *H01L 35/32* (2013.01); *Y10T 29/49826* (2015.01); *H05K 3/22* (2013.01); *H05K 3/3447* (2013.01); *H05K 3/3468* (2013.01); *H05K 2201/10136* (2013.01); *H05K 2201/10219* (2013.01); *H05K 2203/044* (2013.01); *H05K 2203/1121* (2013.01); *H05K 2203/304* (2013.01)

(58) Field of Classification Search
  CPC ........ H01L 35/32; H05K 3/3447; H05K 3/22; H05K 3/3468; H05K 2203/304; H05K 2201/10219; H05K 2203/044; H05K 2203/1121; H05K 2201/10136; F25B 21/04
  USPC ............ 29/25.41, 832, 834, 840, 843; 62/3.2, 62/3.5; 136/203, 204, 225; 228/46, 200
  See application file for complete search history.

(56) References Cited

U.S. PATENT DOCUMENTS 3,554,815 A * 1/1971 Osborn ................. 136/225
3,726,100 A * 4/1973 Widakowich ............ 62/3.2

(Continued)

FOREIGN PATENT DOCUMENTS

EP   1033197 A2   9/2000

OTHER PUBLICATIONS

Tan, Y.M. Fabrication of thermoelectric cooler for device integration, Electronic Packaging Technology Conference, 2005, Proceedings of 7th; issue date Dec. 7-9, 2005.

(Continued)

*Primary Examiner* — Donghai D Nguyen
(74) *Attorney, Agent, or Firm* — Anthony J. Canale

(57) ABSTRACT

Provided is a method for protecting a thermal sensitive component mounted on a board during a thermal process. The method includes: providing the board, providing a protection apparatus which is removable and made of a thermoelectric material to protect the thermal sensitive component during the thermal process, wherein the protection apparatus cools the thermal sensitive component during the thermal process in response to applying a voltage to the protection apparatus. Further provided is the protection apparatus for the thermal sensitive component mounted on the board during the thermal process.

9 Claims, 8 Drawing Sheets

(56) References Cited

U.S. PATENT DOCUMENTS

| | | |
|---|---|---|
| 6,648,210 B1 | 11/2003 | Steen |
| 7,134,592 B2 | 11/2006 | Ensslin et al. |
| 7,156,279 B2 * | 1/2007 | Goenke et al. ............... 228/200 |
| 2005/0151555 A1 | 7/2005 | Lewis et al. |
| 2011/0089462 A1 | 4/2011 | Van Heerden et al. |

OTHER PUBLICATIONS

Raut, Rahul, M.S. Thermal management of heat sensitive components in lead-free assembly and rework process, MAI 44/01, p. 509, Feb. 2006.

* cited by examiner

PROTECTING A THERMAL SENSITIVE COMPONENT IN A THERMAL PROCESS

FIELD OF THE INVENTION

The present invention relates to a protection apparatus and method, and more particularly, to a protection apparatus and method for protecting a thermal sensitive component and preventing the thermal sensitive component from being overheated and thereby damaged during a process.

BACKGROUND

With green awareness on the rise, there is an increasing demand for a lead-free process applicable to printed circuit board assembly (PCBA) technology. For example, nowadays, printed circuit board assembly no longer employs a tin-lead solder but employs a widely-used tin-silver-copper (SAC) alloy solder or tin-copper alloy solder. Normally, the melting point of lead-free solders, tin soldering temperature, and wave soldering temperature are 20° C. to 30° C. higher than that of tin-lead solders, not to mention that lead-free solders adhere to tin less readily; as a result, assembly process providers usually raise the temperature of tin in operation with a view to enhancing the processability thereof.

During a typical printed circuit board assembly process, some thermal sensitive components can only withstand the thermal stress of a eutectic solder at low temperature, but the thermal sensitive components do not meet the high temperature requirements of a lead-free process. For example, constituent components of a liquid crystal display (LCD) include a printed circuit board, and the liquid crystal display cannot withstand the thermal stress of a lead-free wave soldering process.

To overcome the aforesaid limitation of thermal sensitive components, it is often feasible to assemble a liquid crystal display by means of hand soldering. However, the aforesaid conventional process is unreliable, cost-ineffective, and inefficient, when compared with an automated process.

BRIEF SUMMARY

In an aspect of the present invention, the present invention provides a protection apparatus and method for protecting a thermal sensitive component by preventing the thermal sensitive component from being overheated and thereby damaged during a printed circuit board assembly process.

In an aspect of the present invention, the present invention provides a reliable assembly process to be performed on a thermal sensitive component during a lead-free process to thereby meet environmental protection requirements, enhance performance, and achieve high cost-effectiveness.

According to an embodiment of the present invention, a method for protecting a thermal sensitive component during a thermal process comprises: providing a board such that the thermal sensitive component is disposed on the board; providing a protection apparatus made of a thermoelectric material and removable; and protecting the thermal sensitive component with the protection apparatus during the thermal process, wherein the protection apparatus cools the thermal sensitive component during the thermal process in response to applying a voltage to the protection apparatus.

According to another embodiment of the present invention, the protection apparatus comprises a cap body and a battery. The cap body caps the thermal sensitive component and is in thermal communication with the thermal sensitive component during the thermal process. The battery causes the thermoelectric material to produce a thermoelectric effect and thereby cools the thermal sensitive component.

In yet another embodiment of the present invention, the cap body comprises a second body portion and a first body portion disposed on the second body portion. One of the first body portion and the second body portion is made of an P-type thermoelectric material. The other one of the first body portion and the second body portion is made of an N-type thermoelectric material.

In a further embodiment of the present invention, the cap body comprises a first substrate body, a second substrate body, an P-type thermoelectric material chip and an N-type thermoelectric material chip which are disposed between the first substrate body and the second substrate body, and an electrode of an PN junction. The first substrate body and the second substrate body are hermetically sealed to define a hermetically sealed space. Before the step of protecting the thermal sensitive component with the protection apparatus, the method of the present invention further comprises the step of performing a vacuum pumping process on the hermetically sealed space of the protection apparatus.

The present invention provides, in a further embodiment thereof, a protection apparatus for use with a thermal sensitive component disposed on a board during a thermal process. The protection apparatus comprises: a removable device body having a void for containing at least a portion of the thermal sensitive component, being made of a thermoelectric material, and protecting the thermal sensitive component during the thermal process; and a battery for supplying a voltage to the removable device body to thereby enable the protection apparatus to cool the thermal sensitive component.

In a further embodiment of the present invention, the removable device body comprises a second body portion and a first body portion disposed on the second body portion. One of the first body portion and the second body portion is made of an P-type thermoelectric material. The other one of the first body portion and the second body portion is made of an N-type thermoelectric material.

In a further embodiment of the present invention, the removable device body comprises a first substrate body, a second substrate body, an P-type thermoelectric material chip and an N-type thermoelectric material chip which are disposed between the first substrate body and the second substrate body, and an electrode of an PN junction. The first substrate body and the second substrate body are hermetically sealed to define a hermetically sealed space. Before the step of protecting the thermal sensitive component with the protection apparatus, the step of performing a vacuum pumping process on the hermetically sealed space of the protection apparatus.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

Reference throughout this specification to "one embodiment," "an embodiment," or similar language means that a particular feature, structure, or characteristic described in connection with the embodiment may be included in at least one embodiment of the present invention. Thus, appearances of the phrases "in one embodiment," "in an embodiment," and similar language throughout this specification may, but do not necessarily, all refer to the same embodiment.

Figure 1:
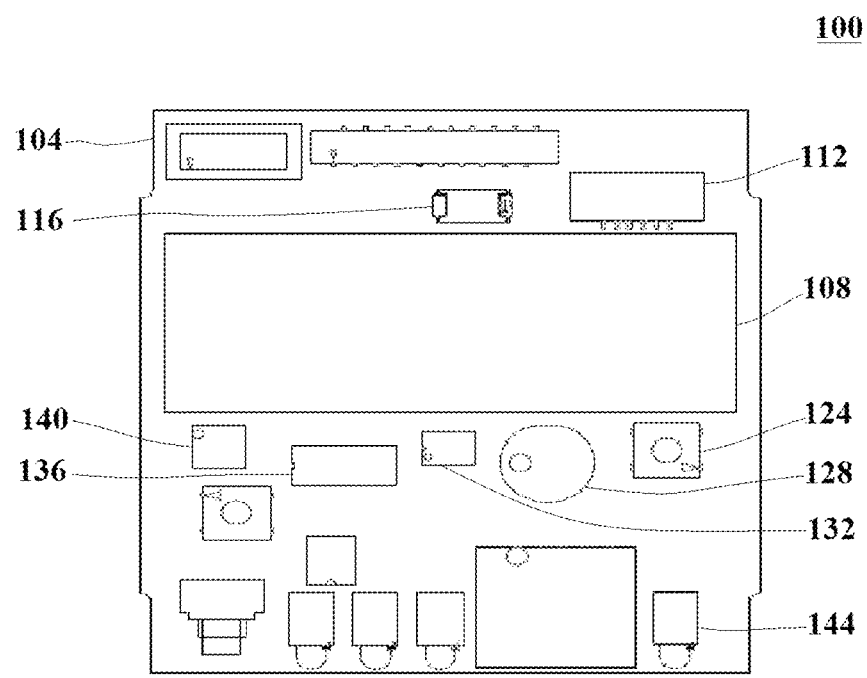
FIG. 1 shows a panel according to an embodiment of the present invention.

The following description begins with FIG. 1 that illustrates an embodiment of the present invention with a view to describing in detail a protection apparatus and a method for use with a thermal sensitive component mounted on a board during a thermal process. Referring to FIG. 1, a panel 100 comprises a board 104 (including but not limited to, for example, a printed circuit board), wherein disposed on the board 104 is a thermal sensitive component 108 (including but not limited to, for example, a display module), and various components which surround the display module 108, including, but not limited to, a man/machine interface 112, a capacitor 116, a switch 124, a transducer 128, a memory 132, a micro controller 136, a pressure sensor 140, a light-emitting diode (LED) 144, and other components (such as an inductor, a resistor, and a connector). The aforesaid components can be conventional components, such as those components for use in conventional data processing systems. The conventional components of this kind can be configured to operate in a way described below.

The printed circuit board 104 is a substrate on which various components are mounted and connected, such that the combination of the components achieves specific functions and advantages. The printed circuit board 104 typically comprises a motherboard, a display card, a panel card, and a wireless network card. The display module 108 is a liquid crystal display module or a plasma display module. The components are mounted on a circuit board by surface mount technology (SMT) when they are SMT components, fixed to the circuit board by wave soldering when they are pinned components, or coupled to the circuit board by any appropriate connection technique, and the present invention is not limited thereto.

In general, a wave soldering process entails turning liquid tin inside a tin furnace into a slender tin wave by means of a pump, and moving a circuit board obliquely upward to pass through the tin wave by means of a conveyor belt to enable the liquid tin to "enter holes" and "perform tin filling" at pin-connecting points of the pinned component, thereby forming solder joints. The aforesaid process is part of a conventional wave soldering process and thus is not described in detail herein for the sake of brevity.

The purpose of the surface mount technology is to mount a component on a substrate of a printed circuit board. The conventional surface mount technology entails positioning components on a circuit board by means of a surface mounter machine and then performing a subsequent process. The surface mounting technique for mounting components on a circuit board is regarded as part of the prior art and thus is not described in detail herein for the sake of brevity. Furthermore, it is also feasible that connection of a component and a circuit board is effectuated in another manner according to the prior art, and thus the present invention is not limited thereto.

Figure 2:
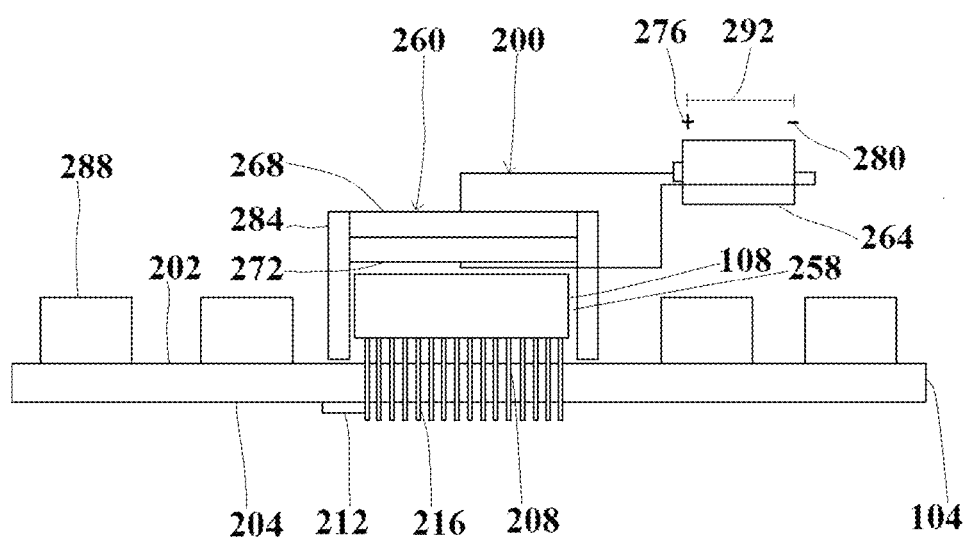
FIG. 2 shows a protection apparatus for use with a thermal sensitive component.

Referring to FIG. 2, there is shown a schematic view of the board 104 (such as a printed circuit board, but the board 104 is not limited thereto), the thermal sensitive component 108 (including but not limited to a display module, an electrolytic capacitor, or a solid-state capacitor, but the thermal sensitive component 108 is not limited thereto), a protection apparatus 200, and a related process thereof according to an embodiment of the present invention. The printed circuit board 104 has a front side 202, a rear side 204, a through hole 208, and a printed circuit 212. In order to be connected to the printed circuit board 104, the display module 108 has a solder connection 216; hence, the solder connection 216 penetrates the through hole 208, and thus the solder connection 216 can be soldered to the printed circuit 212 on the rear side 204. Hence, the solder connection 216, the printed circuit 212, and the display module 108 are present on different sides of the printed circuit board 104, respectively. In addition to the thermal sensitive component 108, electronic components 288 are disposed on the printed circuit board 104. The electronic components 288 are disposed on and attached to the printed circuit board 104 by a soldering process, a wave soldering process, or a hand soldering process.

Thermal sensitive component 108, as the name implies, is a thermal sensitive component, and is likely to be damaged in an overheated environment. Components connected to the circuit board are generally of two types, namely pin-through-hole (PTH) components and surface-mount components. The PTH components are different from the surface-mount components in terms of the degree of their tolerance to heat. The PTH components usually tolerate a temperature of less than 110° C., whereas the surface-mount components usually tolerate a temperature of less than 230° C. At temperature above 100° C., the PTH components, such as display modules, are likely to be permanently damaged because of thermal shock or thermal fatigue. Take an electrolytic capacitor or a solid-state capacitor as an example, it is likely to be permanently damaged because of capacitance splitting at a temperature above 105° C. or 110° C. approximately.

On the other hand, to achieve satisfactory soldering, a soldering process usually requires the display module 108 to stay in a high-temperature environment for a while. In an embodiment of the present invention, a wave soldering process involves positioning the display module 108 on the printed circuit board 104 and then increasing the temperature gradually to 70~95° C. Afterward, a soldering process proper begins and takes place at 90~95° C. typically for at least 30~45 seconds before the temperature drops gradually to prepare for a condensation phase. A high-temperature process which takes place at 95° C. approximately for more than 30 seconds is especially the indication for an environmentally friendly lead-free solder with a view to manufacturing a reliable satisfactory solder joint.

Referring to FIG. 2, in an embodiment of the present invention, the protection apparatus 200 comprises a protection apparatus body 260 having a void 258. The void 258 contains at least a portion of the thermal sensitive component 108. The protection apparatus body 260 is made of a thermoelectric material. The protection apparatus 200 further comprises a battery 264 for applying (supplying) a voltage 292 to the protection apparatus body 260 to thereby allow the protection apparatus 200 to produce a thermoelectric effect whereby the thermal sensitive component 108 is cooled down.

In an embodiment of the present invention, the protection apparatus 200 comprises a cap body 260 and the battery 264. The cap body 260 encloses at least a portion of the thermal sensitive component 108 and is made of a thermoelectric material so as to protect the thermal sensitive component 108 during the thermal process. The battery 264 applies the voltage 292 to the cap body 260 and thereby causes the protection apparatus 200 to produce a thermoelectric effect whereby the thermal sensitive component 108 is cooled down. The cap body 260 comprises a first body portion 268 and a second body portion 272. The first body portion 268 and the second body portion 272 are connected. The first body portion 268 is electrically coupled to an anode 276 of the battery 264, whereas the second body portion 272 is electrically coupled to a cathode 280 of the battery 264. The first body portion 268 is made of an P-type thermoelectric material, whereas the second body portion 272 is made of an N-type thermoelectric material. The P-type thermoelectric material and the N-type thermoelectric material are semiconductors, semimetals, or compounds, which have high thermoelectric figure of merit, including but not limited to antimony (Sb) doped and selenium (Se) doped bismuth telluride $(BiSb)_2(TeSe)_3$ series, lead telluride (PbTe) and lead-tin-telluride (PbSnTe) series, Half-Heusler intermetallic alloy series, silicon (Si) and silicon-germanium (SiGe) series, metal silicides series, or tungsten diselenide ($WSe_2$) series. The first body portion 268 and the second body portion 272 are flat panel-shaped or are of any appropriate shape. The protection apparatus 200 further comprises an engaging element 284, a non-engaging element, and the like which are conducive to capping, for example, a sidewall, or any element of any other appropriate shape, and the present invention is not limited thereto.

In an embodiment, the engaging element 284 is a pair of resilient plates connected to the removable cap body 260 and thereby engaged with the thermal sensitive component 108. The engaging element 284 operates in conjunction with the removable cap body 260 to cap the thermal sensitive component 108 during a thermal process and thereby be in thermal communication with the thermal sensitive component 108, thus cooling the thermal sensitive component 108 by the thermoelectric effect of the thermoelectric material. The engaging element 284 is made of aluminum or any other appropriate materials, and the present invention is not limited thereto. Details of the thermoelectric effect and a protection apparatus/method for use with the cap body 260 and/or the engaging element 284 are described below.

Figure 3:
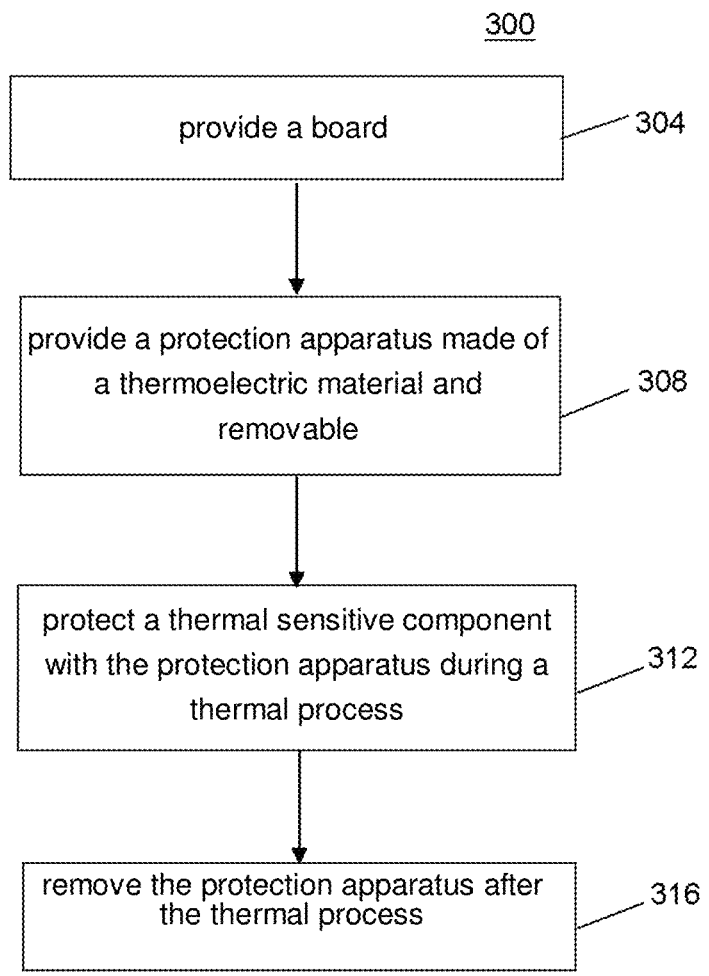
FIG. 3 is a flow chart illustrating a method for protecting a thermal sensitive component during a thermal process.

Referring to FIG. 3, in an embodiment of the present invention, to cater for various high-temperature environments and efficiently protect the thermal sensitive component 108 (such as a display module, but the thermal sensitive component 108 is not limited thereto) disposed on the board 104 (such as a printed circuit board, but the board 104 is not limited thereto), the present invention provides a method 300 of protecting the thermal sensitive component 108 during a thermal process. Referring to FIG. 1 through FIG. 3, the method 300 comprises the steps of: providing a board 104 (step 304); providing the protection apparatus 200 which is made of a thermoelectric material and removable (see FIG. 2) (step 308); protecting the thermal sensitive component 108 with the protection apparatus 200 during a thermal process, wherein, in response to applying the voltage 292 to the protection apparatus 200, the protection apparatus 200 cools the thermal sensitive component 108 during the thermal process (step 312); and removing the protection apparatus from the thermal sensitive component after the thermal process (step 316).

The thermoelectric effect amounts to direct conversion of temperature difference generated from a voltage and vice versa. A thermoelectric device brings about a temperature difference in response to a voltage applied thereto. In another aspect, given a temperature difference between its two ends, the thermoelectric device generates a voltage. In general, the thermoelectric effect applies to cooling an object, heating an object, generating electric power, or measuring temperature.

In general, the thermoelectric effect comprises three defined effects, namely the Seebeck effect, the Peltier effect, and the Thomson effect. Persons skilled in the art are familiar with the thermoelectric effect.

Figure 4:
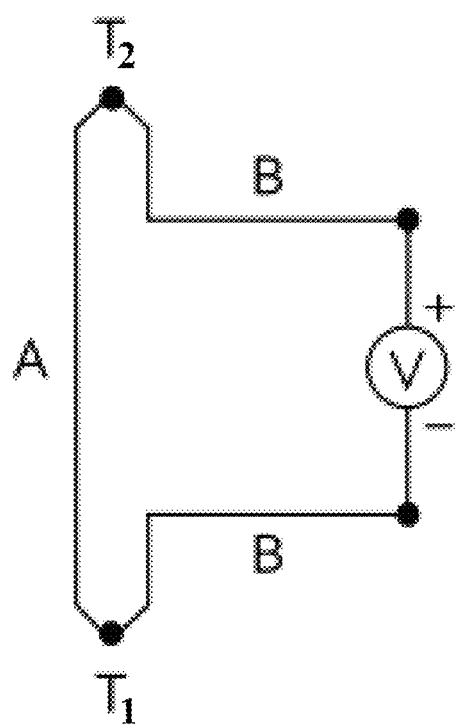
FIG. 4 shows the Seebeck effect of the thermoelectric effect.

FIG. 4 is a circuit diagram that illustrates the Seebeck effect. As shown in FIG. 4, the voltage generated by the Seebeck effect is expressed below, wherein $S_A$ and $S_B$ denote the Seebeck coefficients of metal A and metal B, respectively, wherein $T_1$ and $T_2$ denote the temperatures of the two metals at the junction thereof, respectively. On the other hand, the Peltier effect is the opposite of the Seebeck effect, that is to say, if power is introduced to the loop of two different metals to generate electric potential, there will be a temperature difference at the contact point between the two metals.

$$V = \int_{T_1}^{T_2}(S_B(T) - S_A(T))dT$$

In an embodiment of the present invention, the thermal process is a wave soldering process, an SMT reflow process, a hand soldering process, or a rework process. Broadly speaking, the thermal process is a sub-process of a printed circuit board process, including but not limited to a repairing process, a manufacturing process, or a rework process.

Figure 5:
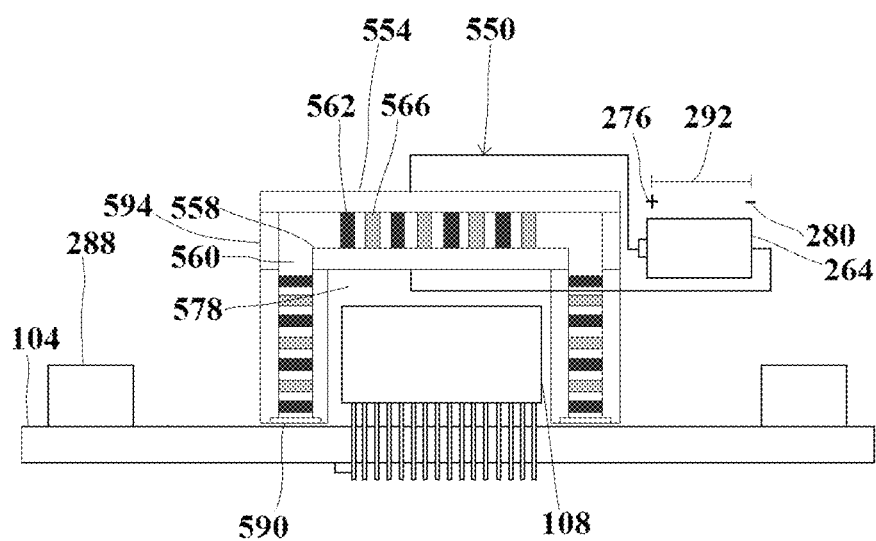
FIG. 5 shows a protection apparatus for use with a thermal sensitive component.

Referring to FIG. 5, in an embodiment of the present invention, there is shown a schematic view of the board 104 (including but not limited to a printed circuit board), the thermal sensitive component 108 (including but not limited to a display module, an electrolytic capacitor, or a solid-state capacitor), a protection apparatus 550, and a related process thereof. In addition to the thermal sensitive component 108, other electronic components 288 are disposed on the board 104. The electronic components 288 are disposed on and attached to the printed circuit board 104 by a soldering process, a wave soldering process, or a hand soldering process.

Likewise, to achieve satisfactory soldering, the thermal sensitive component 108 usually has to stay in a high-temperature environment for a while during a soldering process. Referring to FIG. 5, the protection apparatus 550 has a first substrate body 554, a second substrate body 558, an P-type thermoelectric material chip 562 and an N-type thermoelectric material chip 566 which are disposed between the first substrate body 554 and the second substrate body 558, and an electrode (not shown) of an PN junction. The P-type thermoelectric material chip 562 and the N-type thermoelectric material chip 566 alternate or are arranged in a similar or equivalent manner in order to be disposed between the first substrate body 554 and the second substrate body 558. The first substrate body 554 is an outer casing, whereas the second substrate body 558 is an inner casing. A welding portion 590 is formed by welding technology, such that the first substrate body (outer casing) 554 and the second substrate body (inner casing) 558 are hermetically sealed by the welding portion 590 to form a hermetically sealed space 560 for facilitating a subsequent vacuum pumping process. Likewise, the first substrate body (outer casing) 554 and the second substrate body (inner casing) 558 define a void 578 so as for the second substrate body (inner casing) 558 to contain at least a portion of the thermal sensitive component 108. The protection apparatus 550 has the battery 264 for applying the voltage 292 to the first substrate body (outer casing) 554 and the second substrate body (inner casing) 558 in a similar manner, such that the protection apparatus 550 produces the thermoelectric effect for cooling the thermal sensitive component 108.

The first substrate body (outer casing) 554 and the second substrate body (inner casing) 558 are made of aluminum or any other appropriate materials. The P-type thermoelectric material chip 562 is made of the P-type thermoelectric material. The N-type thermoelectric material chip 566 is made of the N-type thermoelectric material. The first substrate body (outer casing) 554 and the second substrate body (inner casing) 558 are cap-shaped or of any other appropriate shape. The first substrate body (outer casing) 554 and the second substrate body (inner casing) 558 are integrally formed as a unitary structure or are formed from flat panels welded and jointed together in a hermetically sealed manner by a welding portion 594. The present invention is not limited thereto.

Figure 6:
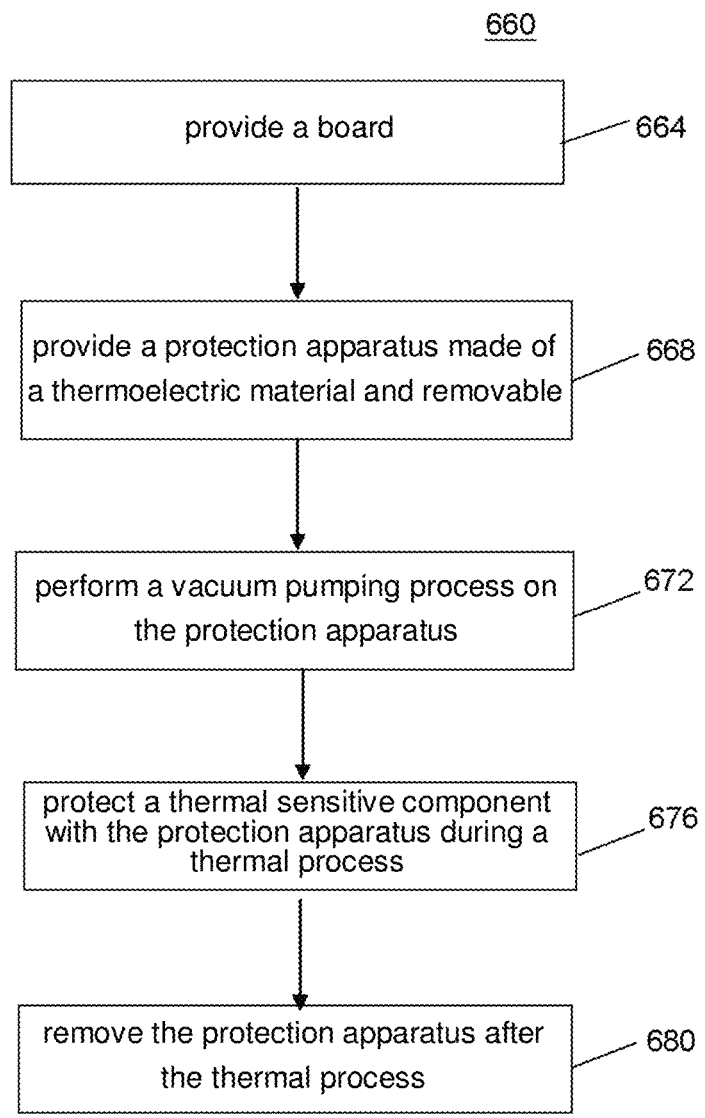
FIG. 6 is a flow chart illustrating another method for protecting a thermal sensitive component during a thermal process.

In an embodiment of the present invention, to cater for various high-temperature environments and efficiently protect the thermal sensitive component 108 (including but not limited to a display module, an electrolytic capacitor, or a solid-state capacitor) disposed on the board 104 (including but not limited to a printed circuit board) in various high-temperature environments, the present invention provides a method 660 of protecting the thermal sensitive component 108 during a thermal process, as shown in FIG. 6. Referring to FIG. 1 through FIG. 5, the method 660 comprises the steps of: providing a board 104 (step 664); providing a protection apparatus 550 made of a thermoelectric material and removable (see FIG. 5) (step 668); performing a vacuum pumping process on the protection apparatus 550 (to decrease the pressure therein to 1 atmospheric pressure approximately) (step 672), wherein the purpose of the vacuum pumping step is to prevent heat transfer and enhance cooling; protecting a thermal sensitive component 108 with the protection apparatus 550 during a thermal process, wherein the protection apparatus 550 cools the thermal sensitive component 108 during the thermal process in response to applying the voltage 292 to the protection apparatus 550 (step 676); and removing the protection apparatus from thermal sensitive component after the thermal process (step 680).

Figure 7:
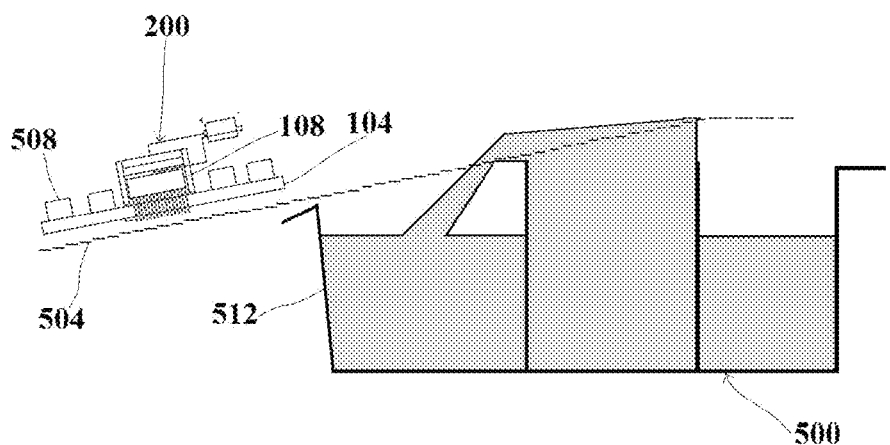
FIG. 7 shows protection of a thermal sensitive component during a wave soldering process.

Referring to FIG. 7, there is shown a schematic view of protecting a thermal sensitive component 108 during a wave soldering process according to an embodiment of the present invention. In addition to the thermal sensitive component 108, other electronic components 508 are disposed on the printed circuit board 104. Referring to FIG. 1 through FIG. 6, the printed circuit board 104 has the through hole 208 adapted to be penetrated by the solder connection 216 on the thermal sensitive component 108. As shown in FIG. 7, the solder connection 216 is connected to the printed circuit 212 of the printed circuit board 104 (wherein the printed circuit 212 and the thermal sensitive component 108 are disposed on different sides of the board 104, respectively) by a wave soldering process. Referring to FIG. 7, the wave soldering process employs a conventional wave soldering device 500 that comprises a tunnel 504, a wave soldering tank 512, and other constituent components not shown. The conventional wave soldering device 500 further comprises an outer casing, a conveying device (for conveying a workpiece to be soldered along the tunnel 504), and a pre-heating region. The aforesaid components are regarded as part of the conventional wave soldering device 500 and thus are not described in detail herein for the sake of brevity. A wave soldering process is performed at a typical temperature of 90° C. to 260° C. During the wave soldering process, the protection apparatus 200 (or the protection apparatus 550 in FIG. 5) is thermally coupled to the thermal sensitive component 108, such that the protection apparatus 200 not only provides thermal insulation to the thermal sensitive component 108 but also provides a cold source whereby the temperature of the thermal sensitive component 108 is prevented from rising because of the wave soldering process. Afterward, upon termination of the wave soldering process, the protection apparatus 200 is removed.

Figure 8:
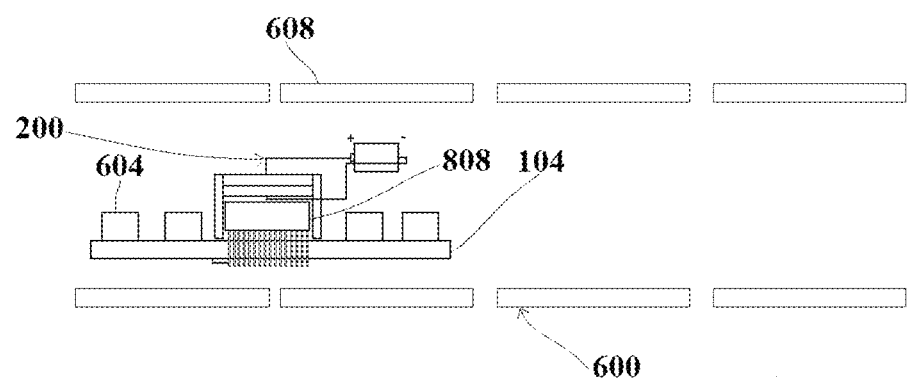
FIG. 8 shows protection a thermal sensitive component during an SMT reflow process.

Referring to FIG. 8, there is shown a schematic view of protecting a thermal sensitive component 808 during an SMT reflow process. In an embodiment of the present invention, during a reflow process of the SMT thermal sensitive component 808, the SMT thermal sensitive component 808 features a heat tolerance temperature of 230° C. approximately for 20 to 40 seconds. When protected by the protection apparatus 200 of FIG. 2 (or the protection apparatus 550 of FIG. 5), the SMT thermal sensitive component 808 features a heat tolerance temperature (for example, 230° C.) for an extended period of time (for example, 30 to 80 seconds.) Referring to FIG. 8, where details of an embodiment are depicted, in addition to the thermal sensitive component 108, other electronic components 604 are disposed on the printed circuit board 104. The electronic components 604 are mounted on the printed circuit board 104 by an SMT process. FIG. 8 also illustrates an SMT reflow process and a device related thereto. As shown in FIG. 8, the SMT reflow process employs a conventional SMT reflow oven 600 that comprises a reflow oven body 608 and constituent components not shown. The conventional SMT reflow oven 600 further comprises a conveying device for conveying a workpiece through the reflow oven body 608 for undergoing a reflow process. The aforesaid components are regarded as part of the conventional SMT reflow oven 600 and thus are not described in detail herein for the sake of brevity. The SMT reflow process is performed at a typical temperature of 183° C. to 260° C. During the SMT reflow process, the protection apparatus 200 (or the protection apparatus 550 of FIG. 5) is thermally coupled to the thermal sensitive component 108, such that the protection apparatus 200 not only provides thermal insulation to the thermal sensitive component 108 but also provides a cold source whereby the temperature of the thermal sensitive component 108 is prevented from rising because of the SMT reflow process, thereby keeping the thermal sensitive component 108 below 230° C. approximately. Upon termination of the SMT reflow process, the protection apparatus 200 is removed.

The cooling effect produced by the wave soldering process as depicted in FIG. 7 is described below. Assuming a maximum target temperature of 100° C., an expected temperature of 95° C., a current temperature of 125° C., and a process duration of 28 seconds approximately, the rate at which heat energy is removed from or introduced into a workpiece (i.e., the thermal sensitive component 108), that is, Q (in watts), is calculated with the following equation:

$$Q = mC_p(T_s - T_f)/t, \text{ wherein}$$

m denotes mass (weight) (Kg) of a workpiece, $C_p$ denotes enthalpy ratio (heat capacity, J/Kg° C.) of the workpiece, T denotes time (in seconds) taken to decrease (or increase) workpiece temperature, $T_s$ denotes initial temperature (° C.), and $T_f$ denotes final temperature (° C.).

Hence, in an embodiment, given a workpiece with a weight of 10.6 g and $C_p$ of 0.6 J/Kg° C., the heat to be removed is calculated as follows:

$$Q = 10.6/1000 * 1000 * 0.6 * (125-95)/28 = 6.8$$

According to a typical exemplary embodiment of the present invention, various thermal processes are advantageously characterized in that, not only is the thermal sensitive component efficiently protected and assured efficient heat dissipation and cooling, but the process/assembly efficiency is greatly enhanced, and thus the thermal processes are applicable to any workpieces which have temperature limitations. For example, the present invention improves on the prior art by improving the process/assembly efficiency which is otherwise deteriorated as a result of performing hand soldering or mini wave soldering on a thermal sensitive component; hence, the present invention is applicable to various processes and saves costs, not to mention that the high temperature-tolerant process further enhances product conforming rate efficiently.

Although a typical embodiment is exemplified by a display module and a protection apparatus having a cap body, protection apparatuses of different forms and shapes include but are not limited to a ring-shaped body and a sleeve-shaped body. In addition to a display module, the protection apparatus of the present invention is applicable to other thermal sensitive components, including but not limited to an electrolytic capacitor, or a solid-state capacitor, as the above-mentioned is not restrictive of the present invention.

Reference herein to features, advantages, or similar language does not imply that all of the features and advantages that may be realized with the present invention should be or are in any single embodiment of the invention. Rather, language referring to features and advantages is understood to mean that a specific feature, advantage, or characteristic described in connection with an embodiment may be included in at least one embodiment of the present invention. Thus, discussion herein of the features and advantages, and similar language, may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for protecting a thermal sensitive component during a thermal process, the method comprising:
   providing the thermal sensitive component disposed on a board;
   providing a protection apparatus comprising a thermoelectric material; and
   protecting the thermal sensitive component with the protection apparatus during the thermal process, wherein the thermal process comprises a sub-process of a board process, and the board process comprises a manufacturing process, a repairing process or a rework process, and further wherein protection apparatus actively cools the thermal sensitive component during the thermal process in response to applying a voltage to the protection apparatus.

2. The method of claim 1, wherein the board comprises a printed circuit board.

3. The method of claim 1, wherein the thermal process is a wave soldering process occurring at 90° C. to 260° C. and using the board having a through hole penetrable by a solder connection on the thermal sensitive component, or is a surface mount technology (SMT) reflow process occurring at 183° C. to 260° C. and using the board further comprising electronic components mounted thereon by the SMT process.

4. The method of claim 1, further comprising:
   connecting a solder connection to a printed circuit of the board by a wave soldering process, wherein the printed circuit and the thermal sensitive component are disposed on different sides of the board, respectively; and
   removing the protection apparatus in response to termination of the wave soldering process.

5. The method of claim 4, wherein, during the wave soldering process, the protection apparatus is thermally coupled to the thermal sensitive component, such that the protection apparatus provides thermal insulation to the thermal sensitive component and provides a cold source due to a thermoelectric effect to prevent the temperature of the thermal sensitive component from rising as a result of the wave soldering process.

6. The method of claim 1, wherein the protection apparatus comprises a cap body and a battery, the cap body capping the thermal sensitive component and being in thermal communication with the thermal sensitive component during the thermal process, and the battery causing the thermoelectric material to produce a thermoelectric effect and thereby cooling the thermal sensitive component.

7. The method of claim 6, wherein the cap body comprises a second body portion and a first body portion disposed on the second body portion, wherein one of the first body portion and the second body portion is made of an P-type thermoelectric material, wherein the other one of the first body portion and the second body portion is made of an N-type thermoelectric material.

8. The method of claim 6, wherein the cap body comprises a first substrate body, a second substrate body, an P-type thermoelectric material chip and an N-type thermoelectric material chip which are disposed between the first substrate body and the second substrate body, and an electrode of an PN junction, wherein the first substrate body and the second substrate body are hermetically sealed to define a hermetically sealed space.

9. The method of claim 8 further comprising, before protecting the thermal sensitive component with the protection apparatus, performing a vacuum pumping process on the hermetically sealed space of the protection apparatus.

* * * * *